(12) United States Patent
Yamazaki et al.

(10) Patent No.: US 9,748,921 B2
(45) Date of Patent: Aug. 29, 2017

(54) ELECTRONIC DEVICE, ELECTRONIC APPARATUS, AND MOVING OBJECT

(71) Applicant: Seiko Epson Corporation, Tokyo (JP)

(72) Inventors: Takashi Yamazaki, Shiojiri (JP); Masahiro Ishii, Suwa (JP)

(73) Assignee: Seiko Epson Corporation (JP)

( * ) Notice: Subject to any disclaimer, the term of this patent is extended or adjusted under 35 U.S.C. 154(b) by 170 days.

(21) Appl. No.: 14/721,441

(22) Filed: May 26, 2015

(65) Prior Publication Data

US 2015/0349746 A1    Dec. 3, 2015

(30) Foreign Application Priority Data

May 29, 2014   (JP) ................................. 2014-110946

(51) Int. Cl.
*H03H 9/21*  (2006.01)
*H03H 9/10*  (2006.01)
*H03H 3/02*  (2006.01)

(52) U.S. Cl.
CPC ............ *H03H 9/21* (2013.01); *H03H 9/1035* (2013.01); *H03H 2003/026* (2013.01)

(58) Field of Classification Search
CPC .................................. H03H 9/21; H03H 9/215
USPC ........................................................ 310/370
See application file for complete search history.

(56) References Cited

U.S. PATENT DOCUMENTS

| | | | | | |
|---|---|---|---|---|---|
| 4,969,359 A | * | 11/1990 | Mikkor | ............... | G01P 15/0802 338/46 |
| 5,542,297 A | * | 8/1996 | Mizuno | ................. | G01P 15/123 73/514.33 |
| 5,579,148 A | * | 11/1996 | Nishikawa | ........... | G02B 26/085 235/462.36 |
| 7,639,096 B2 | * | 12/2009 | Ikeda | ................. | G01C 19/5607 310/311 |
| 2006/0243049 A1 | * | 11/2006 | Ohta | ................... | G01C 19/5607 73/504.12 |
| 2014/0021829 A1 | * | 1/2014 | Kubota | ................ | H03H 9/1021 310/351 |
| 2015/0022274 A1 | * | 1/2015 | Yamazaki | ............... | C23C 14/06 331/156 |
| 2015/0022275 A1 | * | 1/2015 | Yamazaki | ............ | H03H 9/1014 331/158 |
| 2016/0076890 A1 | * | 3/2016 | Yi | ...................... | G01C 19/5607 73/504.16 |

FOREIGN PATENT DOCUMENTS

| | | |
|---|---|---|
| JP | 2000-180178 A | 6/2000 |
| JP | 2001-313537 A | 11/2001 |
| JP | 2005-241382 A | 9/2005 |
| JP | 2006-308325 A | 11/2006 |
| JP | 2011-033393 A | 2/2011 |

* cited by examiner

*Primary Examiner* — J. San Martin

(74) *Attorney, Agent, or Firm* — Harness, Dickey & Pierce, P.L.C.

(57) ABSTRACT

A vibrator (electronic device) includes: a vibrator element including vibrating arms; a base portion supporting the vibrator element and having a rectangular shape in a plan view; and a lid provided on the side of the vibrator element opposite to the base portion 3. Extending directions of long and short sides of the base portion and an extending direction of the vibrating arms cross each other. When an angle formed by the vibrating arms and a Y-axis direction is θ, the angle θ is more than 0° and less than 90°.

11 Claims, 11 Drawing Sheets

ELECTRONIC DEVICE, ELECTRONIC APPARATUS, AND MOVING OBJECT

BACKGROUND

1. Technical Field

The present invention relates to an electronic device, an electronic apparatus, and a moving object.

2. Related Art

As electronic devices such as oscillators or gyro sensors, an electronic device including a tuning fork-type vibrator including a plurality of vibrating arms has been known.

For example, a vibrator disclosed in JP-A-2005-241382 includes a single-crystal silicon substrate in which a vibrating arm is formed, a reference electrode, a piezoelectric body, a drive electrode, and detection electrodes. In the vibrator, the piezoelectric body is expanded and contracted with the application of a voltage between the reference electrode and the drive electrode, so that the vibrating arm is vibrated in the thickness direction of the single-crystal silicon substrate. In such a state, when angular velocity is applied in the longitudinal direction of the vibrating arm, a Coriolis force is generated in a direction vertical to the vibration direction of the vibrating arm. Charge generated by the Coriolis force in the piezoelectric body is output as a signal from the detection electrode, whereby the applied angular velocity can be detected.

In recent years, downsizing of such an electronic device has been strongly demanded. With the progress of downsizing, however, there is a fear of deterioration of vibration characteristics of the vibrator.

SUMMARY

An advantage of some aspects of the invention is to provide an electronic device in which a reduction in the vibration characteristics of a vibrator element is suppressed and whose downsizing is achieved, and an electronic apparatus and a moving object each including the electronic device.

The invention can be implemented as the following application examples.

Application Example 1

An electronic device of this application example includes: a vibrator element including a vibrating arm; and a base portion supporting the vibrator element, wherein in a plan view, an extending direction of a side of the base portion and an extending direction of the vibrating arm cross each other.

With this configuration, the electronic device in which a reduction in the vibration characteristics of the vibrator element is suppressed and whose downsizing is achieved is obtained.

Application Example 2

In the electronic device of the application example, it is preferable that the vibrating arm is supported at one end thereof to the base portion.

With this configuration, since the vibrating arm can be reliably supported, it is possible to suppress the instability of vibration excited by the vibrating arm.

Application Example 3

In the electronic device of the application example, it is preferable that the vibrating arm flexurally vibrates in a thickness direction thereof.

With this configuration, stable vibration can be realized.

Application Example 4

In the electronic device of the application example, it is preferable that the vibrator element includes three vibrating arms.

With this configuration, by causing two vibrating arms next to each other to flexurally vibrate in opposite directions, leak vibrations caused by two sets of vibrating arms, each set including the two vibrating arms next to each other, can be canceled out each other. As a result, vibration leakage is prevented, so that the electronic device capable of outputting a signal with high frequency accuracy is obtained.

Application Example 5

In the electronic device of the application example, it is preferable that the constituent material of the vibrating arm includes silicon.

With this configuration, the vibrating arm with excellent vibration characteristics can be relatively inexpensively realized.

Application Example 6

In the electronic device of the application example, it is preferable that the constituent material of the base portion includes silicon.

With this configuration, the base portion can be formed by etching with high dimensional accuracy.

Application Example 7

In the electronic device of the application example, it is preferable that the constituent material of the base portion includes single-crystal silicon, that the extending direction of the side of the base portion is along a crystal orientation <110> of the single-crystal silicon, and that the extending direction of the vibrating arm is along a crystal orientation <100> of the single-crystal silicon.

With this configuration, the crossing state of the extending direction of the side of the base portion and the extending direction of the vibrating arm can be produced simply and accurately using etching anisotropy of single-crystal silicon. For this reason, it is possible to obtain the electronic device in which the dimensional accuracy of each part is high and thus vibration characteristics are sufficiently close to design values. As a result, the electronic device with small size and high reliability is obtained.

Application Example 8

In the electronic device of the application example, it is preferable that the electronic device further includes a terminal portion arranged in parallel with the vibrator element in the plan view.

With this configuration, the electronic device with high mountability is obtained.

Application Example 9

In the electronic device of the application example, it is preferable that the electronic device further includes a lid portion covering the vibrator element and connected to the base portion.

With this configuration, the vibrator element can be protected.

Application Example 10

An electronic apparatus of this application example includes the electronic device of the application example described above.

With this configuration, the electronic apparatus with high reliability is obtained.

Application Example 11

A moving object of this application example includes the electronic device of the application example described above.

With this configuration, the moving object with high reliability is obtained.

BRIEF DESCRIPTION OF THE DRAWINGS

The invention will be described with reference to the accompanying drawings, wherein like numbers reference like elements.

FIGS. 5A to 5C are cross-sectional views for explaining a method of manufacturing the vibrator shown in FIG. 1 and the like.

FIGS. 6A to 6C are cross-sectional views for explaining the method of manufacturing the vibrator shown in FIG. 1 and the like.

FIG. 7 is a cross-sectional view for explaining the method of manufacturing the vibrator shown in FIG. 1 and the like.

DESCRIPTION OF EXEMPLARY EMBODIMENTS

Hereinafter, an electronic device, an electronic apparatus, and a moving object according to the invention will be described in detail based on embodiments shown in the accompanying drawings.

Vibrator

First, a vibrator to which an embodiment of the electronic device according to the invention is applied will be described.

Figure 1:
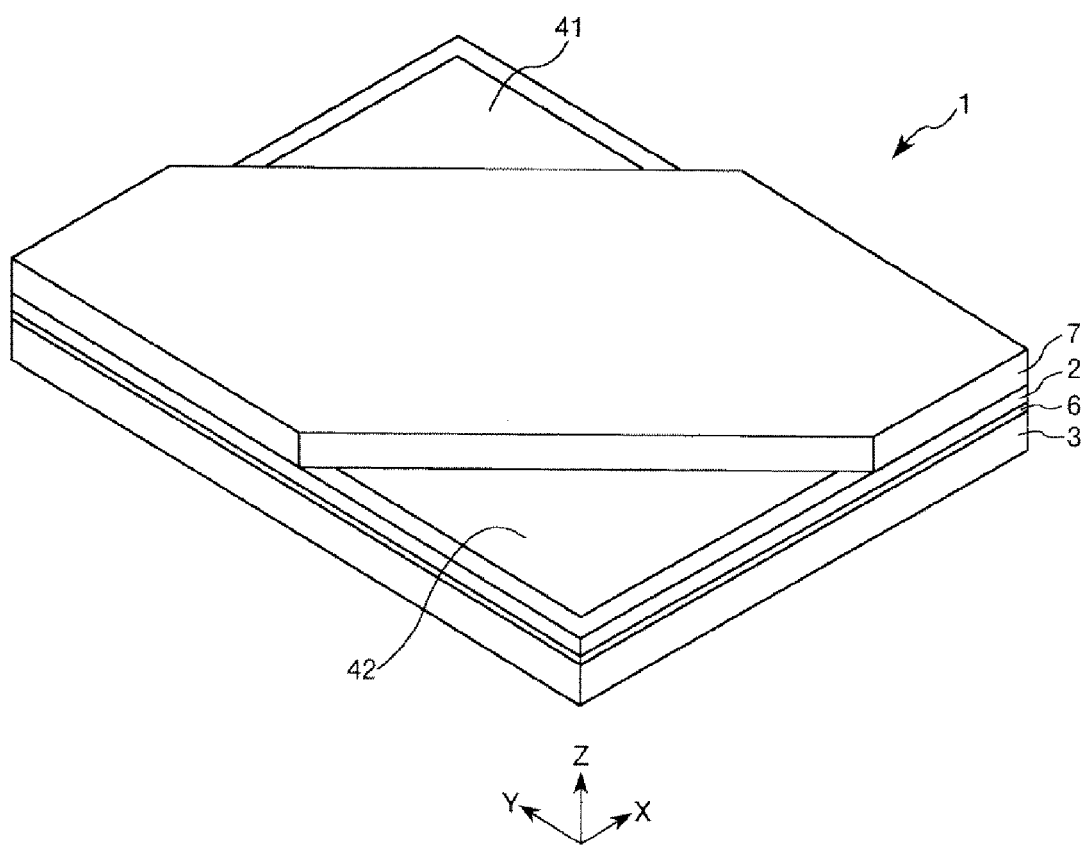
FIG. 1 is a perspective view showing a vibrator to which an embodiment of an electronic device according to the invention is applied.
Figure 2:
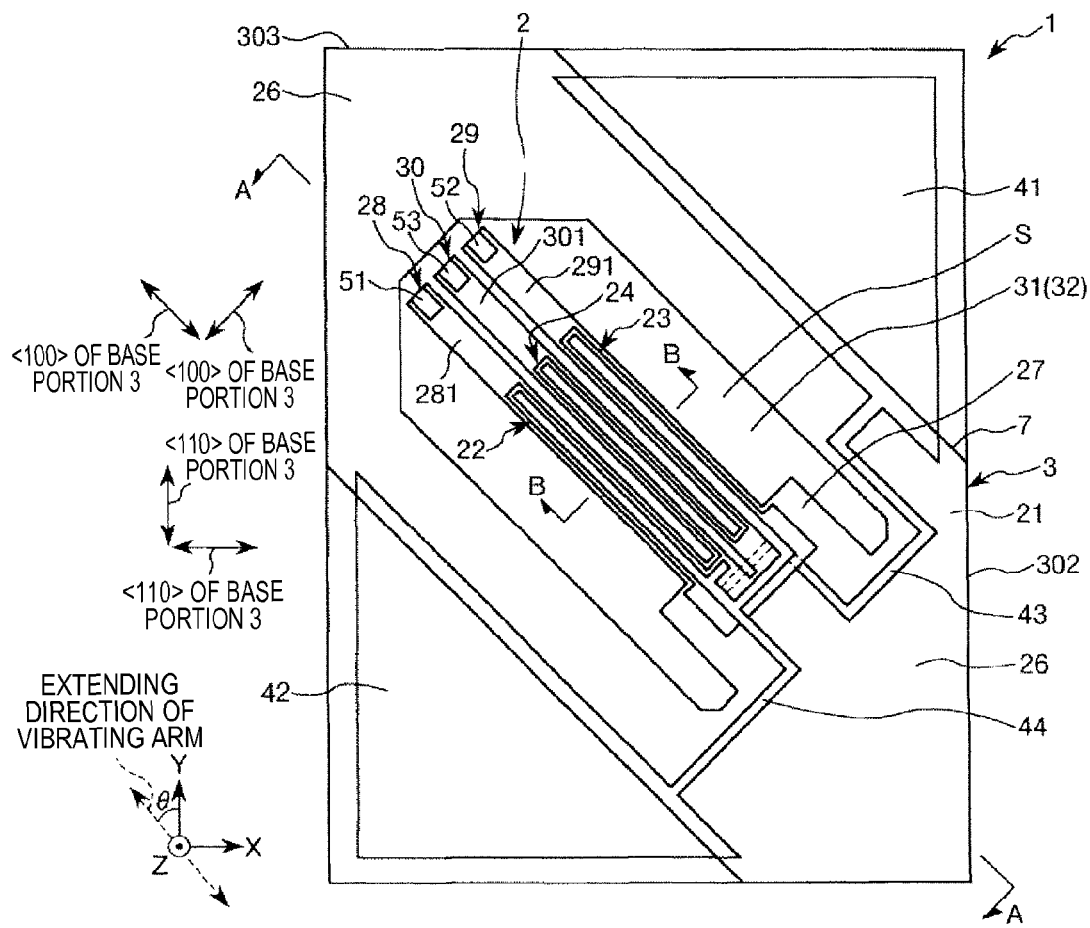
FIG. 2 is a see-through top view of the vibrator shown in FIG. 1.
Figure 3:
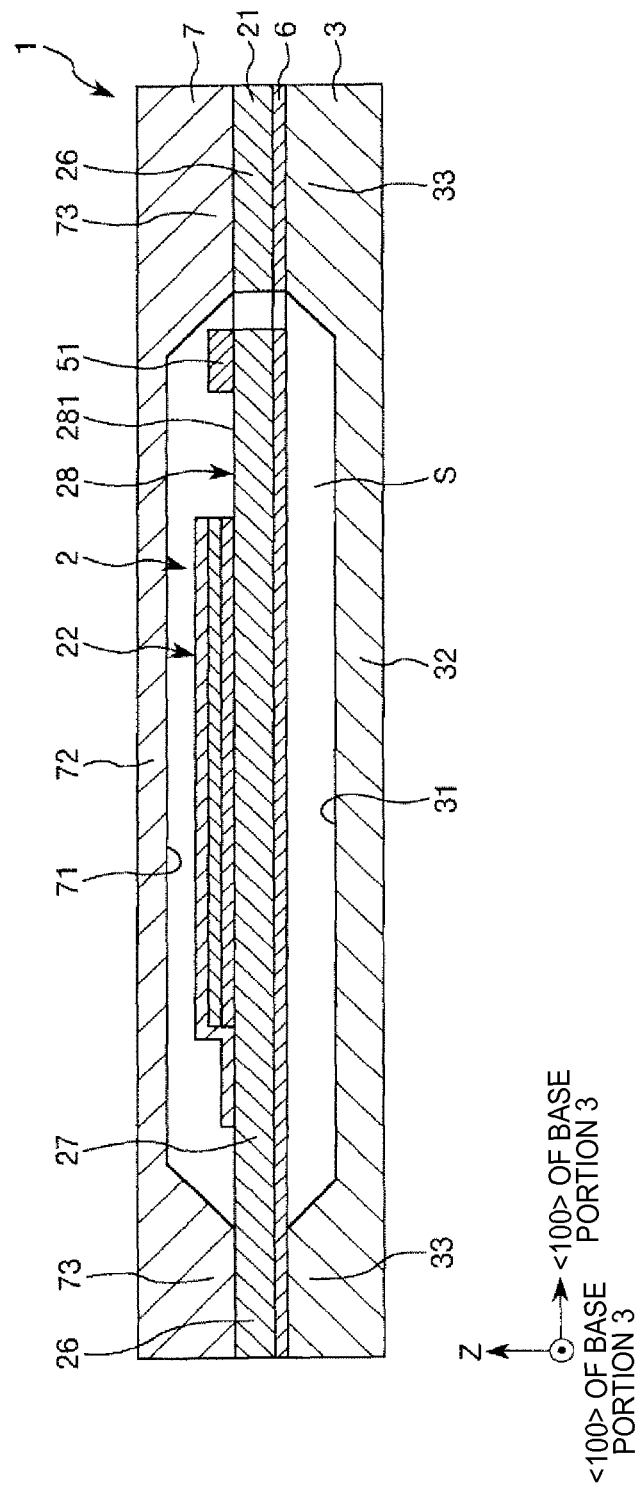
FIG. 3 is a cross-sectional view taken along the line A-A in FIG. 2.
Figure 4:
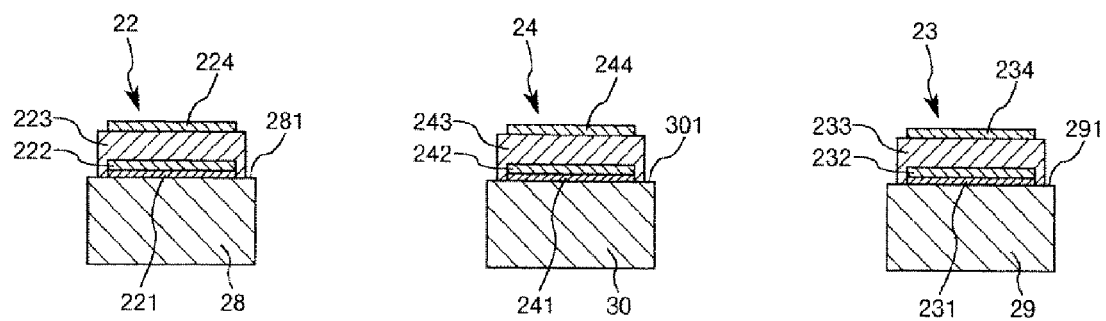
FIG. 4 is a cross-sectional view taken along the line B-B in FIG. 2.

FIG. 1 is a perspective view showing the vibrator to which the embodiment of the electronic device according to the invention is applied. FIG. 2 is a see-through top view of the vibrator shown in FIG. 1. FIG. 3 is a cross-sectional view taken along the line A-A in FIG. 2. FIG. 4 is a cross-sectional view taken along the line B-B in FIG. 2.

In the drawings, an X-axis, a Y-axis, and a Z-axis are illustrated as three axes orthogonal to each other for convenience of description. In the following, a direction parallel to the X-axis is referred to as an X-axis direction, a direction parallel to the Y-axis is referred to as a Y-axis direction, and a direction parallel to the Z-axis is referred to as a Z-axis direction. Moreover, in the following description, the upper, lower, right, and left sides in FIG. 3 are referred to as "up", "down", "right", and "left", respectively, for convenience of description. In FIG. 3, some parts included in the vibrator are not illustrated for convenience of description.

The vibrator (electronic device) 1 shown in FIG. 1 includes a vibrator element 2, a base portion 3 provided below the vibrator element 2, an intermediate layer 6 provided between the vibrator element 2 and the base portion 3, and a lid 7 provided above the vibrator element 2.

Hereinafter, the parts constituting the vibrator 1 will be sequentially described in detail.

Vibrator Element

A vibrating substrate 21 shown in FIG. 2 has a substantially plate shape whose thickness direction is the Z-axis direction, and includes a base 27, three vibrating arms 28, 29, and 30, and a frame portion 26.

The vibrator element 2 is a tripod tuning fork-type vibrator element shown in FIG. 2. The vibrator element 2 includes piezoelectric bodies 22, 23, and 24, terminal portions 41 and 42, and mass portions 51, 52, and 53, all of which are provided on the vibrating substrate 21.

The constituent material of the vibrating substrate 21 is not particularly limited as long as desired vibration characteristics can be provided, and various kinds of piezoelectric materials and various kinds of non-piezoelectric materials can be used.

For example, examples of the piezoelectric material include quartz crystal, lithium tantalate, lithium niobate, lithium borate, and barium titanate. In particular, quartz crystal (an X-cut plate, an AT-cut plate, a Z-cut plate, and the like) is preferably used as a piezoelectric material constituting the vibrating substrate 21. When the vibrating substrate 21 is composed of quartz crystal, vibration characteristics (particularly frequency-temperature characteristics) of the vibrating substrate 21 can be made excellent. Moreover, the vibrating substrate 21 can be formed by etching with high dimensional accuracy.

Examples of the non-piezoelectric material include, for example, silicon, ceramics, and glass. In particular, various kinds of silicon such as single-crystal silicon, polycrystalline silicon, and amorphous silicon are preferably used as a non-piezoelectric material constituting the vibrating substrate 21. When the vibrating substrate 21 is composed of silicon, the vibrating substrate 21 with excellent vibration characteristics can be realized relatively inexpensively. Moreover, the vibrator element 2 and other circuit elements are easily integrated by, for example, forming an integrated circuit in the base 27. In particular, with the use of single-crystal silicon, the vibrating substrate 21 can be formed by etching with high dimensional accuracy.

Base Portion

The base portion 3 has a substantially plate shape whose thickness direction is the Z-axis direction, and includes a recess 31 that opens on the positive Z side. Specifically, the base portion 3 includes a flat plate-shaped plate body 32 and a frame body 33 provided at a peripheral portion of an upper surface of the plate body 32. The inside space of the frame body 33 corresponds to the recess 31. Although the external shape of the frame body 33 may be different from the external shape of the vibrating substrate 21, the external shapes coincide with each other in the embodiment.

The constituent material of the base portion 3 is not particularly limited as long as the material has a mechanical strength necessary for supporting the vibrating substrate 21, and, for example, various kinds of silicon materials, various kinds of ceramics materials, various kinds of glass materials, and the like can be used.

In these materials, silicon is particularly preferably used, and single-crystal silicon is more preferably used. With the use of silicon, the base portion 3 can be efficiently formed by etching with high dimensional accuracy.

The base portion 3 according to the embodiment is composed of single-crystal silicon. The base portion 3 has a rectangular shape (oblong shape), in a plan view, with its long axis parallel to the Y-axis direction and its short axis parallel to the X-axis direction. Moreover, a crystal orientation <110> of the single-crystal silicon constituting the base portion 3 is parallel to the X-axis direction and the Y-axis direction. That is, long sides 302 and short sides 303 of the base portion 3 are parallel to the crystal orientation <110> of the single-crystal silicon constituting the base portion 3. The crystal orientation <110> collectively expresses a crystal orientation [110] and its equivalents.

It is sufficient that the base portion 3 has a rectangular shape in the plan view. The rectangular shape includes, in addition to an oblong, a square and a shape based on an oblong or a square. The shape based on an oblong or a square means a quadrilateral whose interior angle differs from 90° (for example, a quadrilateral whose interior angle differs from 90° within a range of about 90±5°), a quadrilateral whose corners are chamfered or rounded, or the like.

The recess 31 is provided corresponding to the inside region of the frame portion 26 of the vibrating substrate 21. That is, the recess 31 is provided so as to contain the base 27 and the vibrating arms 28, 29, and 30 in the plan view from a direction parallel to the Z-axis. With this configuration, the vibrating arms 28, 29, and 30 can be displaced downward in FIG. 3 by an amount corresponding to the recess 31.

Lid

The lid 7 (lid portion) has a substantially plate shape whose thickness direction is the Z-axis direction, and includes a recess 71 that opens on the negative Z side. Specifically, the lid 7 includes a flat plate-shaped plate body 72 and a frame body 73 provided at a peripheral portion of a lower surface of the plate body 72. The inside space of the frame body 73 corresponds to the recess 71.

The constituent material of the lid 7 is not particularly limited as long as the material has a mechanical strength necessary for protecting the vibrator element 2. For example, various kinds of silicon materials, various kinds of ceramics materials, various kinds of glass materials, various kinds of metal materials, and the like can be used.

In these materials, single-crystal silicon is particularly preferably used. With the use of single-crystal silicon, the lid 7 can be efficiently formed by etching with high dimensional accuracy.

The recess 71 is provided corresponding to the inside region of the frame portion 26 of the vibrating substrate 21. That is, the recess 71 is provided so as to correspond to the recess 31 in the plan view from the direction parallel to the Z-axis. With this configuration, the vibrating arms 28, 29, and 30 can also be displaced upward in FIG. 3 by an amount corresponding to the recess 71.

As shown in FIG. 2, the lid 7 has a hexagonal shape in the plan view. Moreover, the lid 7 is configured so as to be smaller than the vibrating substrate 21 or the base portion 3. When the vibrator 1 is viewed from above, portions of the vibrating substrate 21 protrude from the lid 7. The terminal portions 41 and 42 are provided at the protruding portions.

Intermediate Layer

The intermediate layer 6 is provided between the vibrating substrate 21 and the base portion 3. The intermediate layer 6 bonds the frame portion 26 of the vibrating substrate 21 and the base portion 3 together. With this configuration, the frame portion 26 of the vibrating substrate 21 and the base portion 3 are hermetically sealed.

The lid 7 is bonded to the frame portion 26 of the vibrating substrate 21. With this configuration, the frame portion 26 of the vibrating substrate 21 and the lid 7 are hermetically sealed. The bonding method of the lid 7 and the vibrating substrate 21 is not particularly limited, and examples of the bonding method include, for example, direct bonding, anodic bonding, metal bonding using a brazing material or solder, welding, and caulking.

Since the base portion 3, the vibrating substrate 21, and the lid 7 are bonded together in this manner, a space S defined by the recess 31, the recess 71, and the frame portion 26 is insulated from the outside. By performing the bonding of the intermediate layer 6 with the vibrating substrate 21 and the bonding of the vibrating substrate 21 with the base portion 3 under a reduced pressure or under an inert gas atmosphere, a reduced-pressure state or an inert gas sealed state can be maintained in the space S.

Vibrating Substrate

The vibrating substrate 21 has a substantially plate shape whose thickness direction is the Z-axis direction. Moreover, the vibrating arms 28, 29, and 30 extend in the same direction as each other from the base 27.

The extending direction of the vibrating arms 28, 29, and 30 crosses an extending direction of the long side 302 of the base portion 3. In the case of the embodiment, when an angle formed by the extending direction of the vibrating arms 28, 29, and 30 and the Y-axis direction is θ, the angle θ is more than 0° and less than 90°. By setting the extending direction of the vibrating arms 28, 29, and 30 and the extending direction of the long side 302 of the base portion 3 so as to satisfy the condition, a relatively long length of the vibrating arms 28, 29, and 30 can be ensured without increasing the external size of the base portion 3. In other words, a diagonal of the base portion 3 is longer than the long side 302, and therefore, by extending the vibrating arms 28, 29, and 30 along the direction of the diagonal, the downsizing of the base portion 3 can be achieved without shortening the length of the vibrating arms 28, 29, and 30. As a result, the vibrator 1 with small size can be realized while suppressing deterioration of vibration characteristics, such as an increase in crystal impedance (CI value) or a reduction in resonance sharpness (Q value).

Although it is sufficient that the angle θ formed by the extending direction of the vibrating arms 28, 29, and 30 and the Y-axis direction is more than 0° and less than 90° as described above, the angle θ is preferably from 40° to 50° and more preferably from 44° 30' to 45° 30'. By setting the angle θ within the range, a sufficiently long length of the vibrating arms 28, 29, and 30 can be ensured without increasing the external size of the base portion 3. Therefore, both the suppression of deterioration of vibration characteristics and the downsizing of the vibrator 1 can be highly achieved.

In the above description, the range of the angle θ is defined with the angle formed by the extending direction of the vibrating arms 28, 29, and 30 and the Y-axis direction as θ. However, the angle θ may be an angle formed by the extending direction of the vibrating arms 28, 29, and 30 and the X-axis direction. Also in this case, the angle θ is preferably within the range.

Moreover, in the embodiment, the extending direction of the vibrating arms 28, 29, and 30 is parallel to the crystal orientation <100> of the single-crystal silicon constituting the base portion 3. The crystal orientation <100> collectively expresses the crystal orientation [100] and its equivalents (for example, [010] or [001]).

Hence, it can be said in the embodiment that the angle θ formed by the extending direction of the vibrating arms 28, 29, and 30 and the Y-axis direction is equal to an angle formed by the crystal orientation <110> and the crystal orientation <100> of the single-crystal silicon constituting the base portion 3. As described above, extending directions of the long side 302 and the short side 303 of the base portion 3 are parallel to the crystal orientation <110> of the single-crystal silicon constituting the base portion 3, and the extending direction of the vibrating arms 28, 29, and 30 is parallel to the crystal orientation <100> of the single-crystal silicon constituting the base portion 3, so that a crossing state of the former directions and the latter direction can be produced simply and accurately using etching anisotropy of single-crystal silicon. For this reason, in the vibrator 1 according to the embodiment, the dimensional accuracy of each part is high, so that it is easy to bring vibration characteristics close to design values. As a result, the vibrator 1 with small size and high reliability can be realized.

The extending directions of the vibrating arms 28, 29, and 30 are parallel to each other, and the vibrating arms 28, 29, and 30 are arranged in parallel in a direction orthogonal to the extending direction of the vibrating arms 28, 29, and 30. In the vibrating arms 28, 29, and 30, the vibrating arm 30 is located between the vibrating arm 28 and the vibrating arm 29.

Ends (base ends) of the vibrating arms 28, 29, and 30 on the base 27 side are fixed ends, while ends (tip ends) on the side opposite to the base 27 are free ends. Moreover, an end of the base 27 on the side opposite to the vibrating arms 28, 29, and 30 is connected to the frame portion 26. In the plan view, the frame portion 26 has a frame shape, on the inside of which the base 27 and the vibrating arms 28, 29, and 30 are disposed. Moreover, the frame portion 26, the base 27, and the vibrating arms 28, 29, and 30 are integrally formed. As described above, since the frame portion 26 is supported so as to be interposed between the base portion 3 and the lid 7, the base ends of the vibrating arms 28, 29, and 30 are supported to the base portion 3 via the base 27 or the frame portion 26. With this configuration, the vibrating arms 28, 29, and 30 can be reliably supported, and therefore, it is possible to suppress the instability of vibrations excited by the vibrating arms 28, 29, and 30.

Each of the vibrating arms 28, 29, and 30 has a constant width over the entire region in the longitudinal direction. Each of the vibrating arms 28, 29, and 30 may include a portion having a different width.

Moreover, the vibrating arms 28, 29, and 30 are formed equal in length to each other. The lengths of the vibrating arms 28, 29, and 30 are set according to the widths, thicknesses, or the like of the vibrating arms 28, 29, and 30, and may be different from each other.

At the tip end of each of the vibrating arms 28, 29, and 30, a mass portion (hammerhead) having a larger transverse cross-sectional area than that of the base end may be provided as necessary. In this case, the vibrator element 2 can be further downsized, or the frequency of flexural vibration of the vibrating arms 28, 29, and 30 can be further lowered.

Mass Portion

As shown in FIGS. 2 and 3, the mass portion 51 is provided on an upper surface 281 of the vibrating arm 28. The mass portion 51 is used to adjust the resonance frequency of the vibrating arm 28 by, for example, removing a portion or all of the mass portion through irradiation with an energy beam and thereby reducing the mass. Similarly, the mass portion 52 is provided on an upper surface 291 of the vibrating arm 29; and the mass portion 53 is provided on an upper surface 301 of the vibrating arm 30.

Piezoelectric Element

As shown in FIGS. 2 to 4, the piezoelectric body 22 is provided on the vibrating arm 28; the piezoelectric body 23 is provided on the vibrating arm 29; and the piezoelectric body 24 is provided on the vibrating arm 30. With this configuration, even when the vibrating arms 28, 29, and 30 themselves are not piezoelectric, or even when the vibrating arms 28, 29, and 30 are piezoelectric but the direction of the polarization axis or crystal axis is not suitable for flexural vibration in the Z-axis direction, each of the vibrating arms 28, 29, and 30 can be flexurally vibrated relatively simply and efficiently in the Z-axis direction. With this configuration, stable vibration can be realized. Moreover, since it does not matter whether the vibrating arms 28, 29, and 30 are piezoelectric or not, or in which direction the polarization axis or crystal axis lies, the range of choices for the material of the vibrating arms 28, 29, and 30 is expanded. Therefore, the vibrator element 2 having desired vibration characteristics can be relatively simply realized.

The piezoelectric body 22 has a function of expanding and contracting through energization to cause the vibrating arm 28 to flexurally vibrate in the Z-axis direction. The piezoelectric body 23 has a function of expanding and contracting through energization to cause the vibrating arm 29 to flexurally vibrate in the Z-axis direction. The piezoelectric body 24 has a function of expanding and contracting through energization to cause the vibrating arm 30 to flexurally vibrate in the Z-axis direction.

As shown in FIG. 4, the piezoelectric body 22 is composed of an insulator layer 221, a first electrode layer 222, a piezoelectric layer (piezoelectric thin film) 223, and a second electrode layer 224 stacked in this order on the vibrating arm 28. Similarly, the piezoelectric body 23 is composed of an insulator layer 231, a first electrode layer 232, a piezoelectric layer (piezoelectric thin film) 233, and a second electrode layer 234 stacked in this order on the vibrating arm 29. The piezoelectric body 24 is composed of an insulator layer 241, a first electrode layer 242, a piezoelectric layer (piezoelectric thin film) 243, and a second electrode layer 244 stacked in this order on the vibrating arm 30.

Hereinafter, the layers constituting the piezoelectric body 22 will be sequentially described in detail. The configuration of the layers of each of the piezoelectric bodies 23 and 24 is similar to that of the piezoelectric body 22, and therefore, the description thereof is omitted.

First Electrode Layer

The first electrode layer 222 is provided on the base 27 and the vibrating arm 28, from the base 27 to the vibrating arm 28, along the extending direction of the vibrating arm 28.

In the embodiment, the length of the first electrode layer 222 is shorter than the length of the vibrating arm 28, on the vibrating arm 28.

The first electrode layer 222 can be formed from a metal material such as gold (Au), a gold alloy, platinum (Pt), aluminum (Al), an aluminum alloy, silver (Ag), a silver alloy, chromium (Cr), a chromium alloy, copper (Cu), molybdenum (Mo), niobium (Nb), tungsten (W), iron (Fe), titanium (Ti), titanium nitride (TiN), cobalt (Co), zinc (Zn), or zirconium (Zr), or a transparent electrode material such as ITO or ZnO.

The average thickness of the first electrode layer 222 is not particularly limited, but is preferably, for example, about from 1 nm to 300 nm and more preferably about from 10 nm to 200 nm. With this configuration, the conductivity of the first electrode layer 222 can be made excellent while preventing the first electrode layer 222 from adversely affecting the driving characteristics of the piezoelectric body 22 or the vibration characteristics of the vibrating arm 28.

Insulator Layer

Depending on the constituent material of the vibrating substrate 21, the first electrode layer 222 and the vibrating substrate 21 have to be electrically insulated from each other. Therefore, as in the embodiment, when the vibrating substrate 21 is composed of silicon as semiconductor, it is preferable to provide the insulator layer 221 between the first electrode layer 222 and the vibrating substrate 21.

The insulator layer 221 is composed of, for example, silicon oxide, silicon nitride, aluminum nitride, or the like.

The average thickness of the insulator layer 221 is not particularly limited as long as the first electrode layer 222 and the vibrating substrate 21 can be electrically insulated from each other, but the average thickness is preferably, for example, about from 1 nm to 10 μm. If the thickness is less than the lower limit, an effect of preventing a short circuit may be reduced depending on the constituent material of the insulator layer 221; while if the thickness exceeds the upper limit, the characteristics of the piezoelectric body 22 may be adversely affected depending on the constituent material of the insulator layer 221.

Piezoelectric Layer

The piezoelectric layer 223 is provided on the first electrode layer 222 along the extending direction of the vibrating arm 28. It is preferable that the length of the piezoelectric layer 223 in the extending direction of the vibrating arm 28 is substantially equal to the length of the first electrode layer 222 in the same direction. With this configuration, the piezoelectric layer 223 can be equalized in the longitudinal direction of the vibrating arm 28.

Moreover, an end of the piezoelectric layer 223 on the base 27 side (that is, a base end of the piezoelectric layer 223) is provided so as to straddle a boundary portion between the vibrating arm 28 and the base 27. With this configuration, the driving force of the piezoelectric body 22 can be efficiently transmitted to the vibrating arm 28. Moreover, it is possible to moderate an abrupt change in rigidity at the boundary portion between the vibrating arm 28 and the base 27. Therefore, the Q value of the vibrator element 2 can be increased.

Examples of the constituent material (piezoelectric material) of the piezoelectric layer 223 include, for example, zinc oxide (ZnO), aluminum nitride (AlN), lithium tantalate (LiTaO$_3$), lithium niobate (LiNbO$_3$), potassium niobate (KNbO$_3$), lithium tetraborate (Li$_2$B$_4$O$_7$), barium titanate (BaTiO$_3$), and PZT (lead zirconate titanate), and AlN or ZnO is preferably used.

In these materials, ZnO or AlN is preferably used as the constituent material of the piezoelectric layer 223. ZnO (zinc oxide) or aluminum nitride (AlN) has excellent c-axis orientation. Therefore, the piezoelectric layer 223 is configured using ZnO as a main material, whereby the CI value of the vibrator element 2 can be reduced. Moreover, these materials can be deposited by, for example, a reactive sputtering method.

The average thickness of the piezoelectric layer 223 is preferably about from 50 nm to 3000 nm and more preferably about from 200 nm to 2000 nm. With this configuration, the driving characteristics of the piezoelectric body 22 can be made excellent while preventing the piezoelectric layer 223 from adversely affecting the vibration characteristics of the vibrating arm 28.

Second Electrode Layer

The second electrode layer 224 is provided along the extending direction of the vibrating arm 28.

The length of the second electrode layer 224 in the extending direction of the vibrating arm 28 is substantially equal to the length of the piezoelectric layer 223. With this configuration, the entire region of the piezoelectric layer 223 can be expanded and contracted in the extending direction of the vibrating arm 28 with an electric field generated between the second electrode layer 224 and the first electrode layer 222. Therefore, vibration efficiency can be increased.

The second electrode layer 224 can be formed from a material appropriately selected from the materials described as the constituent materials of the first electrode layer 222.

The average thickness of the second electrode layer 224 is not particularly limited, but is preferably, for example, about from 1 nm to 300 nm and more preferably about from 10 nm to 200 nm. With this configuration, the conductivity of the second electrode layer 224 can be made excellent while preventing the second electrode layer 224 from adversely affecting the driving characteristics of the piezoelectric body 22 or the vibration characteristics of the vibrating arm 28.

Terminal Portion

The terminal portions 41 and 42, connection wires 43 and 44, and the like can be formed from a material appropriately selected from the materials described as the constituent materials of the first electrode layer 222. Moreover, the terminal portions 41 and 42, the connection wires 43 and 44, and the like can be collectively formed simultaneously with the first electrode layers 222, 232, and 242 or the second electrode layers 224, 234, and 244.

In the embodiment, the base portion 3 has a rectangular shape in the plan view, while the lid 7 has a hexagonal shape. Since it is sufficient for the lid 7 to be able to cover the space S, the external shape of the lid does not have to conform to the base portion 3, and by making the lid smaller than the base portion 3, regions in which the terminal portions 41 and 42 are exposed can be ensured in the upper surface. In other words, when the vibrator 1 is viewed in the plan view in a see-through manner, the two terminal portions 41 and 42 and the vibrator element 2 are disposed so as to be parallel to each other. As a result, since the terminal portions 41 and 42 can be disposed on the upper surface of the vibrator 1, the mountability can be enhanced. Moreover, since a distance between the terminal portion 41 and the terminal portion 42 can be naturally ensured, a short circuit between the terminal portion 41 and the terminal portion 42 can be easily prevented, and also, work of connecting a wire (not shown) or the like with the terminal portions 41 and 42 can be easily carried out.

In the vibrator element 2 having the configuration described above, when a voltage (voltage for vibrating the vibrating arms 28, 29, and 30) is applied between the terminal portion 41 and the terminal portion 42, a voltage in the Z-axis direction is applied to each of the piezoelectric layers 223, 233, and 243 such that the first electrode layers 222 and 232 and the second electrode layer 244 are opposite in polarity to the first electrode layer 242 and the second electrode layers 224 and 234. With this configuration, the vibrating arms 28, 29, and 30 can be flexurally vibrated at a certain constant frequency (resonance frequency) due to an inverse piezoelectric effect of the piezoelectric material. At this time, the vibrating arms 28 and 29 flexurally vibrate in the same direction as each other, while the vibrating arm 30 flexurally vibrates in the opposite direction from the vibrating arms 28 and 29.

By causing two vibrating arms next to each other to flexurally vibrate in opposite directions from each other as described above, leak vibrations caused by the two vibrating arms 28 and 30 next to each other and the two vibrating arms 29 and 30 next to each other can be canceled out each other. As a result, vibration leakage can be prevented, so that the vibrator 1 capable of outputting a signal with high frequency accuracy is obtained.

Moreover, when the vibrating arms 28, 29, and 30 flexurally vibrate, a voltage at a certain constant frequency is generated between the terminal portions 41 and 42 due to a piezoelectric effect of the piezoelectric material. With the use of these properties, the vibrator element 2 can generate an electric signal that vibrates at a resonance frequency.

Method of Manufacturing Vibrator

Next, a method of manufacturing the vibrator shown in FIG. 1 and the like will be described.

FIGS. 5A to 7 are cross-sectional views for explaining the method of manufacturing the vibrator 1 shown in FIG. 1 and the like. In the following description, the upper and lower sides in FIGS. 5A to 6C are referred to as "up" and "down", respectively, for convenience of description. Moreover, in FIGS. 5A to 7, electrodes, wires, terminal portions, and the like are not illustrated for avoiding complication of the drawings.

The method of manufacturing the vibrator 1 includes: [A] a step of forming the vibrating substrate 21; [B] a step of subjecting a substrate for forming the base portion 3 to an etching process to obtain the base portion 3; and [C] a step of bonding the lid 7 and the vibrating substrate 21 together. The steps will be described below.

[A]

First, a substrate for forming the vibrating substrate 21 is prepared, and the substrate is etched to thereby form the vibrating substrate 21.

Here, with the use of an SOI (Silicon On Insulator) substrate, it is possible to easily prepare a stacked substrate including a substrate for forming the vibrating substrate 21 and a substrate for forming the base portion 3 bonded together via an intermediate layer.

Figure 5A:
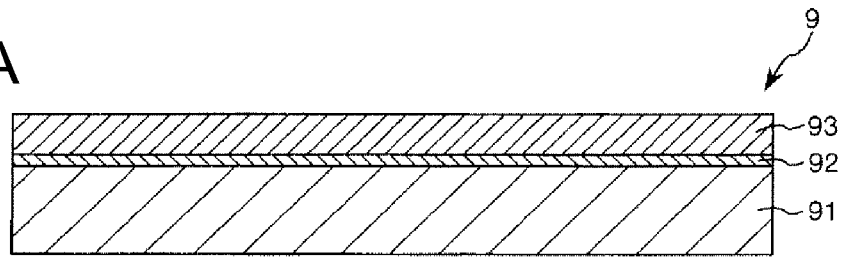

An SOI substrate 9 shown in FIG. 5A is a substrate in which a first Si layer (handle layer) 91, an SiO$_2$ layer (BOX layer) 92, and a second Si layer (device layer) 93 are stacked in this order. In the embodiment, the base portion 3 is formed from the first Si layer 91; the intermediate layer 6 is formed from the SiO$_2$ layer 92; and the vibrating substrate 21 is formed from the second Si layer 93. This procedure will be described below.

Figure 5B:
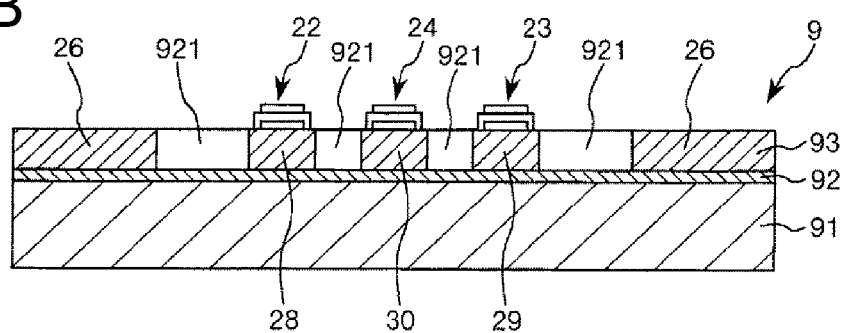
Figure 5C:
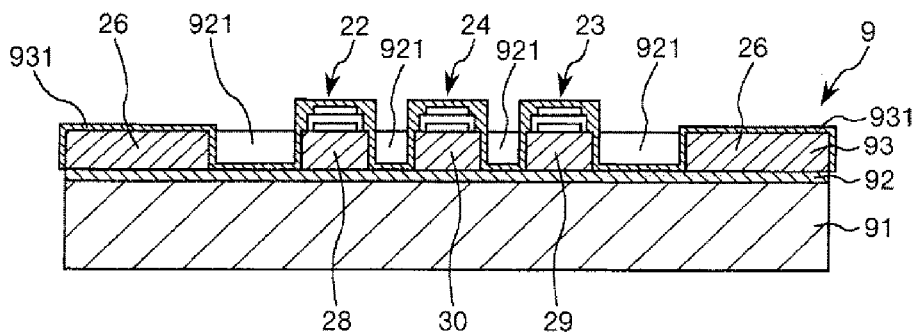

First, the piezoelectric bodies 22, 23, and 24 are formed on the SOI substrate 9. In FIGS. 5A to 5C, the insulator layers are not illustrated.

Next, the vibrating arms 28, 29, and 30 and the like are formed by an etching process on the second Si layer 93 of the SOI substrate 9. This etching process may be a wet etching process, but a dry etching process is preferably used. With this configuration, since the second Si layer 93 can be subjected to an etching process without being affected by etching anisotropy in wet etching, the vibrating arms 28, 29, and 30 and the like with high dimensional accuracy can be formed. Moreover, in this etching process, a region 921 of the second Si layer 93 around the vibrating arms 28, 29, and 30 and the like is etched away as shown in FIG. 5B.

When the SOI substrate 9 is subjected to an etching process, a photolithographic technique is used in combination therewith. In a photolithographic technique, exposure treatment is performed using a projection exposure apparatus such as a stepper or a scanner to form a pattern corresponding to a processing pattern. In the case of the embodiment, by scanning an exposure mask pattern in parallel with the <110> in the projection exposure apparatus, divided exposure treatment necessary when producing a plurality of vibrating substrates 21 from one silicon wafer (multi-piece production) can be efficiently performed. That is, when divided exposure treatment is performed by a general projection exposure apparatus, it is often the case that the scanning direction of an exposure mask pattern is limited to a direction parallel or vertical to the crystal orientation of a silicon wafer. For this reason, the method of manufacturing the vibrator 1 according to the embodiment is effective as a method by which divided exposure treatment can be efficiently performed even when a general projection exposure apparatus is used.

Next, the SOI substrate 9 is subjected to oxide film formation. With this configuration, an oxide film 931 shown in FIG. 5C is formed on a surface of the second Si layer 93 or the SiO$_2$ layer 92 in the region 921. The oxide film 931 functions as a protective film to protect the second Si layer 93 in an etching step described later.

For the oxide film formation, a sputtering method, for example, is used.

Figure 6A:
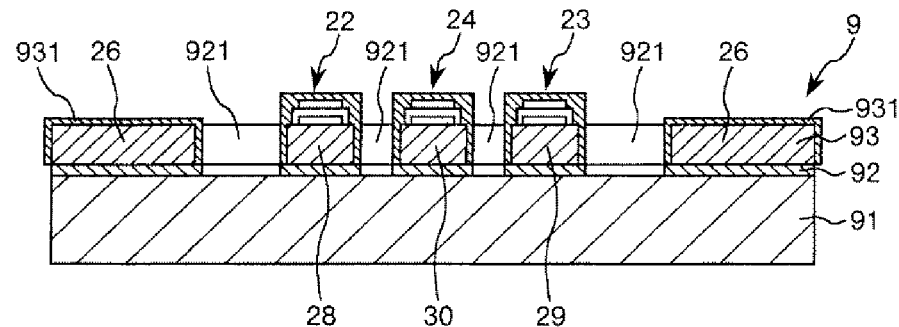

Next, the oxide film 931 and the SiO$_2$ layer 92 in the region 921 are partially subjected to an etching process. With this configuration, the oxide film 931 and the SiO$_2$ layer 92 in the region 921 are partially removed as shown in FIG. 6A.

For this etching process, a dry etching method or a wet etching method, for example, is used with a region other than the region 921 being masked.

[B]

Next, the first Si layer 91 of the SOI substrate 9 subjected to the oxidation treatment is subjected to an etching process. This etching process is performed using the second Si layer 93 and the SiO$_2$ layer 92 as masks. In other words, a portion of the first Si layer 91 corresponding to the region 921 is subjected to an etching process. By appropriately adjusting the conditions of the etching process, the etching process can be performed so as to extend into regions below the second Si layer 93 and the SiO$_2$ layer 92. As a result, the recess 31 shown in FIG. 6B can be formed.

Figure 7:
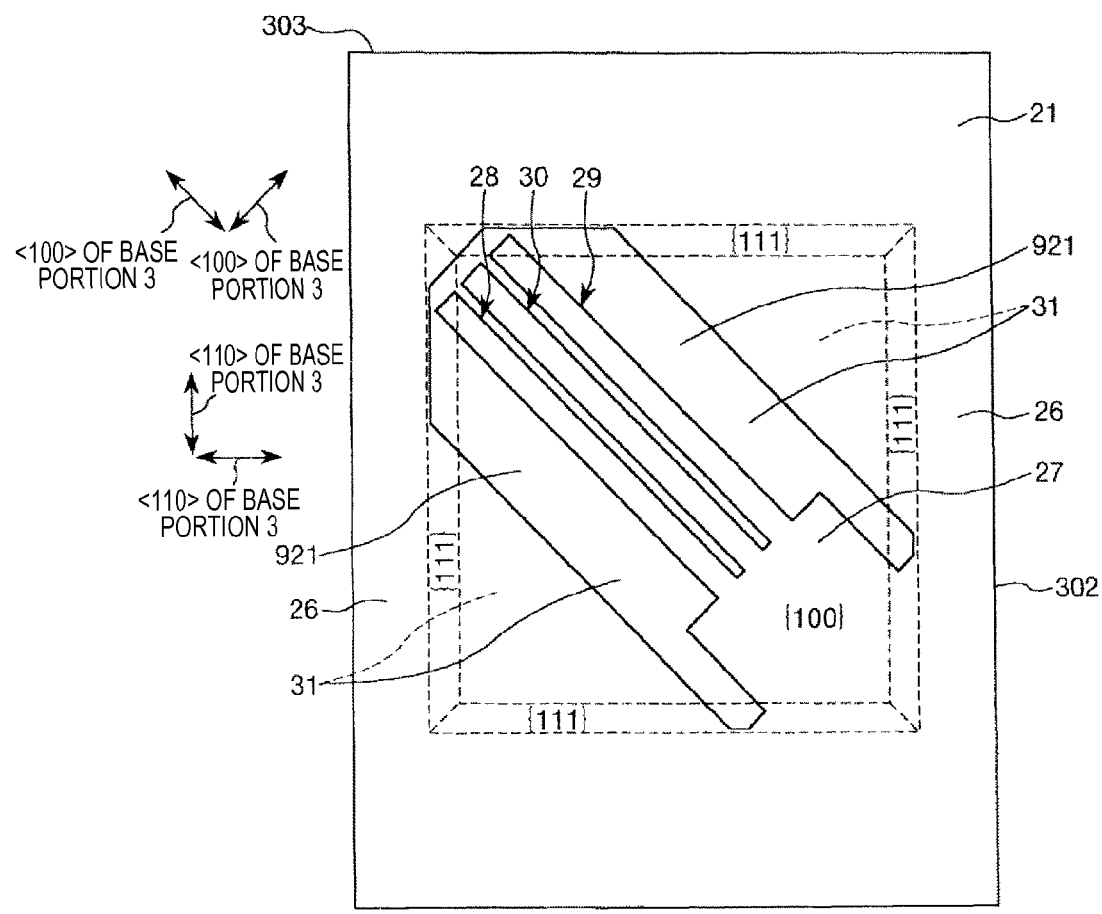

In the vibrator 1 according to the embodiment, as shown in FIG. 7, the long side 302 and the short side 303 of the base portion 3 are parallel to the crystal orientation <110> of the single-crystal silicon constituting the base portion 3. On the other hand, the extending directions of the vibrating arms 28, 29, and 30 are parallel to the crystal orientation <100> of the single-crystal silicon constituting the base portion 3.

Here, in the case of anisotropic wet etching, the etching rate of the crystal plane {111} of Si is much slower than the etching rate of the crystal plane {100} or the crystal plane {110}. For this reason, in an etching process using anisotropic wet etching, when the crystal plane {111} appears, the etching process substantially stops at the time.

Figure 6B:
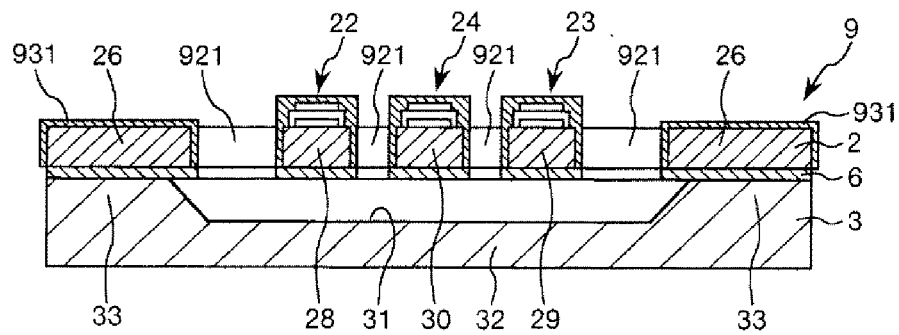

As shown in FIG. 7, in the case where the extending directions of the vibrating arms 28, 29, and 30 are parallel to the crystal orientation <100> of the single-crystal silicon constituting the base portion 3, when the single-crystal silicon is subjected to an anisotropic wet etching process via a mask using the region 921 around the vibrating arms 28, 29, and 30 and the like as an opening, the processing mark is not limited to a region below the region 921 but is formed so as to extend into regions below the vibrating arms 28, 29, and 30 or the frame portion 26 until the crystal plane {111} appears. As a result, the recess 31 provided in the base portion 3 extends not only to the region below the region 921 but also to the regions below the vibrating arms 28, 29, and 30 or the frame portion 26 located behind the mask. In this manner, the recess 31 shown in FIG. 6B is formed, and the base portion 3 is obtained.

According to the method, since the vibrating arms 28, 29, and 30 can be formed with high processing accuracy while using an SOI substrate having high dimensional accuracy, the vibrator 1 with excellent vibration characteristics can be efficiently manufactured.

Examples of etchants used in anisotropic wet etching include, for example, tetramethylammonium hydroxide (TMAH), potassium hydroxide (KOH), ethylenediamine-pyrocatechol-water (EDP), and hydrazine.

Next, the oxide film 931 is removed.

For the removal of the oxide film 931, for example, a wet etching method using buffered hydrofluoric acid (BHF) or the like is used.

Thereafter, wires, terminal portions, and the like (not shown) are formed.

[C]

Figure 6C:
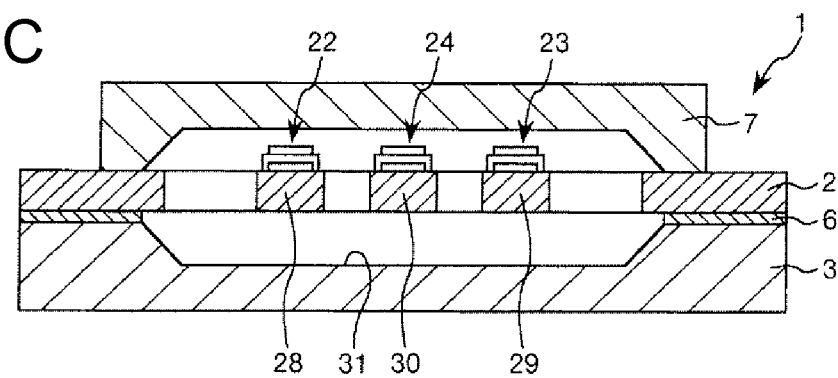

Next, the lid 7 is prepared. Then, the lid 7 and the vibrating substrate 21 are bonded together. With this configuration, the vibrator 1 shown in FIG. 6C is obtained.

The configuration and manufacturing method of the vibrator 1 have been described above. However, the configuration of the vibrator 1 is not limited to the embodiment.

For example, the number of the vibrating arms 28, 29, and 30 included in the vibrator element 2 is not limited to three, and may be two, or four or more.

Moreover, the vibrator 1 may be used as a sensor device to detect a physical quantity such as acceleration, angular velocity, or pressure.

Moreover, the vibrator 1 can be manufactured without using the SOI substrate 9. In this case, for example, an Si substrate is prepared as a substrate for forming the base portion 3, and an oxide film subjected to oxidation treatment is formed on the Si substrate. Next, an Si film is deposited on the oxide film. With this configuration, a substrate substantially equal to an SOI substrate can be manufactured. Examples of the Si film include a polycrystalline silicon film and an amorphous silicon film. Thereafter, the steps are carried out in the same manner as described above, whereby the vibrator 1 can be manufactured.

Moreover, the vibrating substrate 21 may not include the frame portion 26. For example, a structure may be employed, in which the space S is defined by the base portion 3 and the lid 7, and the vibrating substrate 21 may be sealed in the space S.

Moreover, the positions of the terminal portions 41 and 42 are not limited to the upper surface of the vibrating substrate 21, and may be, for example, on an upper surface of the lid 7 or a lower surface of the base portion 3.

Electronic Apparatus

Next, electronic apparatuses (electronic apparatus according to the invention) including the electronic device according to the invention will be described in detail based on FIGS. 8 to 10.

Figure 8:
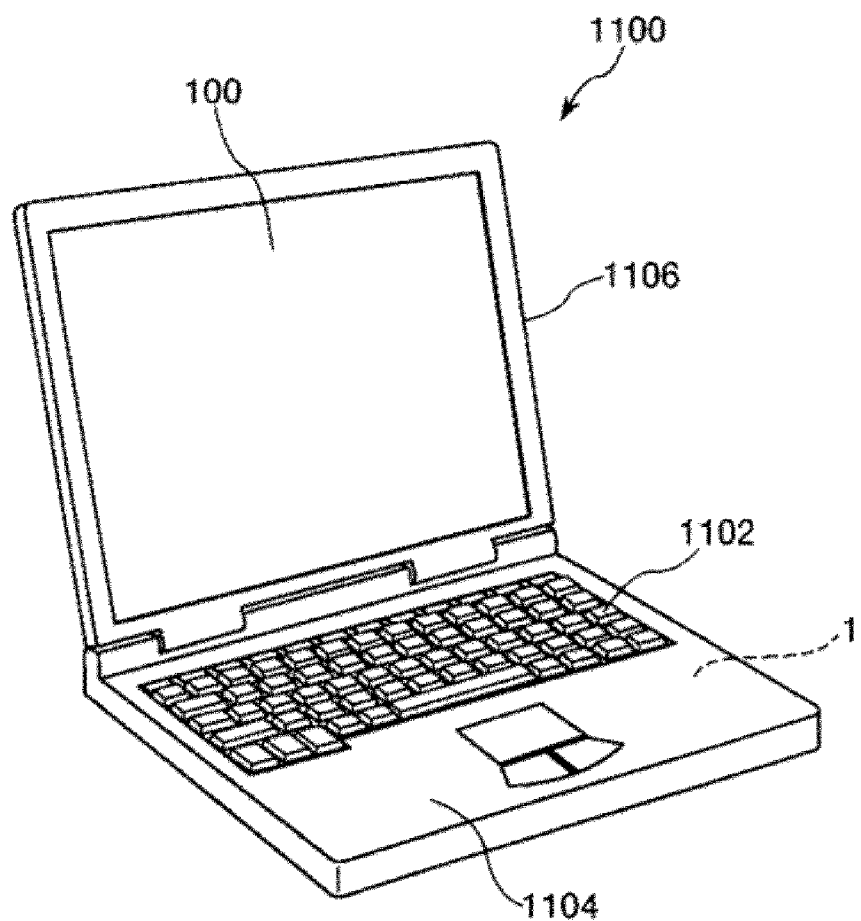
FIG. 8 is a perspective view showing a configuration of a mobile (or notebook) personal computer to which an electronic apparatus including the electronic device according to the invention is applied.

FIG. 8 is a perspective view showing a configuration of a mobile (or notebook) personal computer to which an electronic apparatus including the electronic device according to the invention is applied. In the drawing, the personal computer 1100 is composed of a main body portion 1104 including a keyboard 1102, and a display unit 1106 including a display portion 100. The display unit 1106 is rotatably supported to the main body portion 1104 via a hinge structure portion. Into the personal computer 1100, the vibrator 1 that functions as a filter, a resonator, a reference clock, or the like is built.

Figure 9:
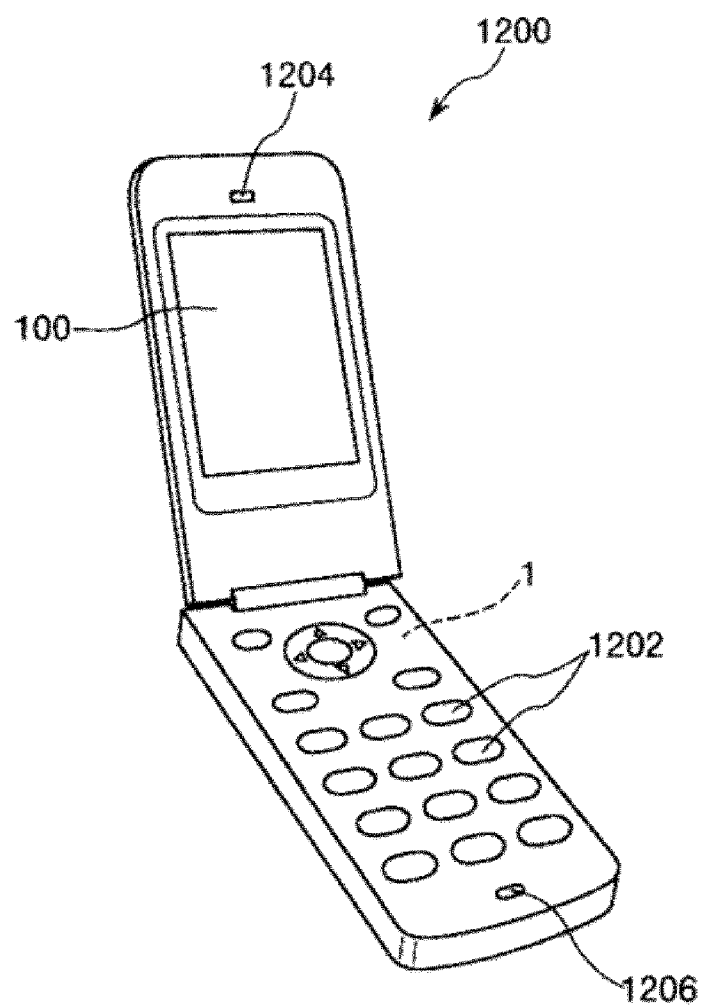
FIG. 9 is a perspective view showing a configuration of a mobile phone (including a PHS) to which an electronic apparatus including the electronic device according to the invention is applied.

FIG. 9 is a perspective view showing a configuration of a mobile phone (including a PHS) to which an electronic apparatus including the electronic device according to the invention is applied. In the drawing, the mobile phone 1200 includes a plurality of operation buttons 1202, an earpiece 1204, and a mouthpiece 1206. The display portion 100 is disposed between the operation buttons 1202 and the earpiece 1204. Into the mobile phone 1200, the vibrator 1 that functions as a filter, a resonator, or the like is built.

Figure 10:
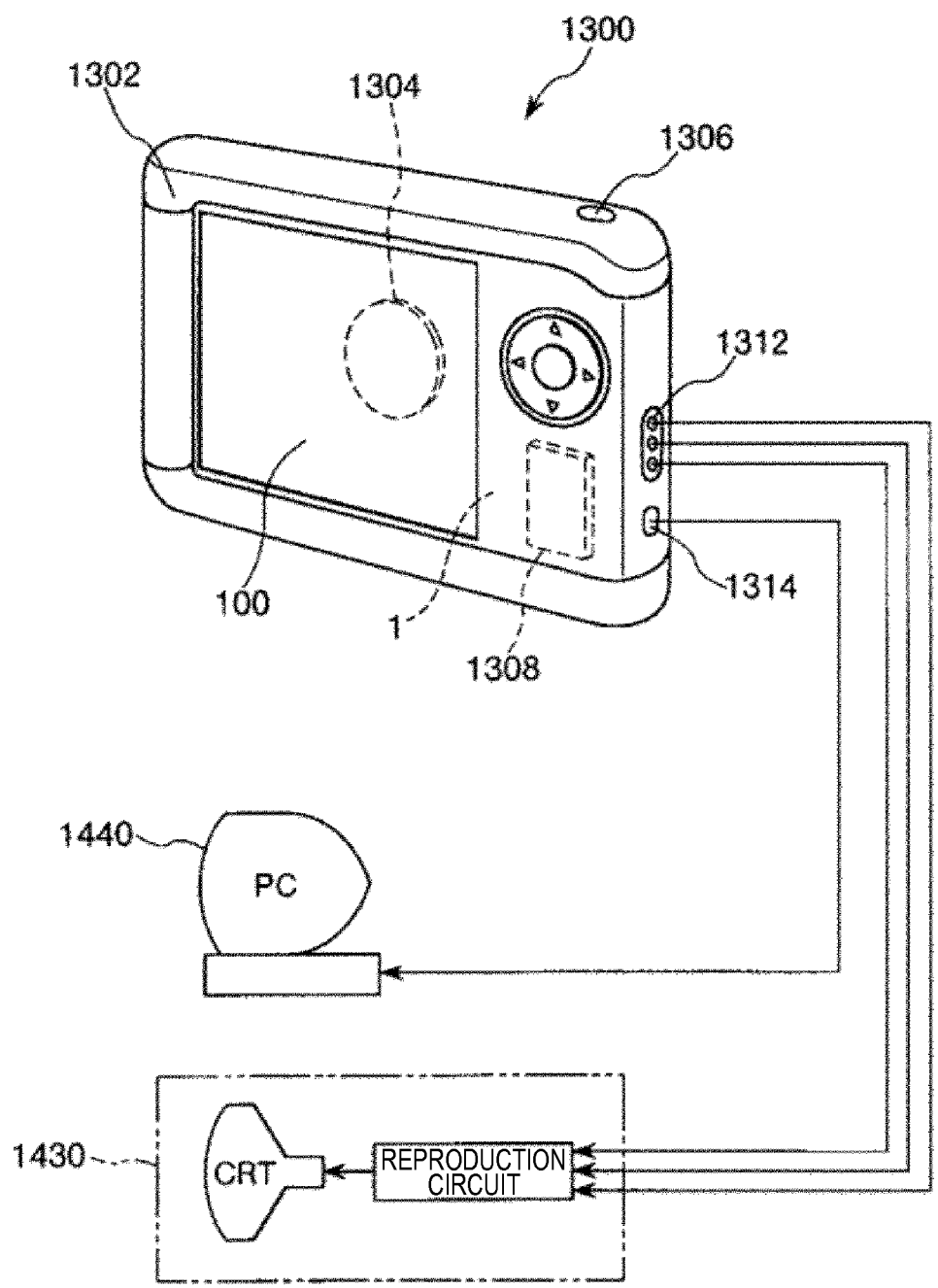
FIG. 10 is a perspective view showing a configuration of a digital still camera to which an electronic apparatus including the electronic device according to the invention is applied.

FIG. 10 is a perspective view showing a configuration of a digital still camera to which an electronic apparatus including the electronic device according to the invention is applied. In the drawing, connections with external apparatuses are also shown in a simplified manner. Here, usual cameras expose a silver halide photographic film with an optical image of a subject, whereas the digital still camera 1300 photoelectrically converts the optical image of the subject with an imaging device such as a CCD (Charge Coupled Device) to generate imaging signals (image signals).

The display portion 100 is provided on aback surface of a case (body) 1302 in the digital still camera 1300 and configured to perform display based on the imaging signals generated by the CCD. The display portion 100 functions as a finder that displays the subject as an electronic image. Moreover, on the front side (the rear side in the drawing) of the case 1302, a light receiving unit 1304 including an optical lens (imaging optical system) and the CCD is provided.

When a photographer confirms the subject image displayed on the display portion and presses down a shutter button 1306, imaging signals of the CCD at the time are transferred to and stored in a memory 1308. In the digital still camera 1300, a video signal output terminal 1312 and a data communication input/output terminal 1314 are provided on a side surface of the case 1302. Then, as shown in the drawing, a television monitor 1430 and a personal computer 1440 are connected as necessary to the video signal output terminal 1312 and the data communication input/output terminal 1314, respectively. Further, the imaging signals stored in the memory 1308 are output to the television monitor 1430 or the personal computer 1440 by a predetermined operation. Into the digital still camera 1300, the vibrator 1 that functions as a filter, a resonator, or the like is built.

In addition to the personal computer (mobile personal computer) shown in FIG. 8, the mobile phone shown in FIG. 9, and the digital still camera shown in FIG. 10, an electronic apparatus including the electronic device according to the invention can be applied to, for example, inkjet ejection apparatuses (for example, inkjet printers), laptop personal computers, television sets, video camcorders, video tape recorders, car navigation systems, pagers, electronic notebooks (including those with communication function), electronic dictionaries, calculators, electronic gaming machines, word processors, workstations, videophones, surveillance television monitors, electronic binoculars, POS terminals, medical apparatuses (for example, electronic thermometers, sphygmomanometers, blood glucose meters, electrocardiogram measuring systems, ultrasonic diagnosis apparatuses, and electronic endoscopes), fishfinders, various types of measuring instrument, indicators (for example, indicators used in vehicles, aircraft, and ships), and flight simulators.

Moving Object

Next, a moving object (moving object according to the invention) including the electronic device according to the invention will be described.

Figure 11:
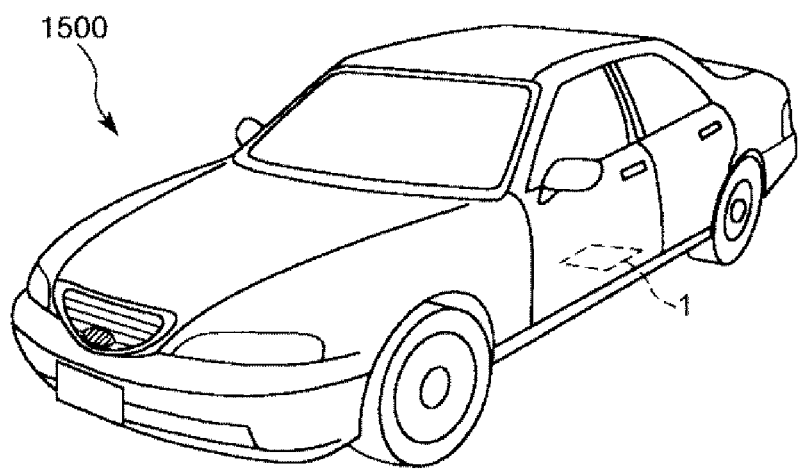
FIG. 11 is a perspective view schematically showing an automobile as an example of a moving object according to the invention.

FIG. 11 is a perspective view schematically showing an automobile as an example of the moving object according to the invention. In the automobile 1500, the vibrator 1 is mounted. The vibrator 1 can be widely applied to electronic control units (ECUs) such as for keyless entry systems, immobilizers, car navigation systems, car air-conditioners, anti-lock brake systems (ABSs), air bags, tire pressure monitoring systems (TPMSs), engine control, battery monitors for hybrid and electric automobiles, and car body attitude control systems.

The invention has been described based on the preferred embodiments, but the invention is not limited to the embodiments. The configuration of each part can be replaced with any configuration having a similar function.

Moreover, any configuration may be added to the embodiments in the invention.

The entire disclosure of Japanese Patent Application No. 2014-110946, filed May 29, 2014 is expressly incorporated by reference herein.

What is claimed is:

1. An electronic device comprising:
   a vibrator element including a vibrating arm extending from a base of the vibrator element in an extending direction; and
   a base portion supporting the vibrator element, the base portion including a frame body defining a recess in a plate body of the base portion, the base of the vibrator element being disposed on the frame body such that the vibrating arm extends over the recess, and the frame body including a long side extending in an extending direction of the base portion, wherein
   in a plan view, the extending direction of the long side and the extending direction of the vibrating arm cross each other.

2. The electronic device according to claim 1, wherein the vibrating arm is supported at one end thereof to the base portion.

3. The electronic device according to claim 1, wherein the vibrating arm flexurally vibrates in a thickness direction thereof.

4. The electronic device according to claim 1, wherein the vibrator element includes three vibrating arms.

5. The electronic device according to claim 1, wherein the constituent material of the vibrating arm includes silicon.

6. The electronic device according to claim 1, wherein the constituent material of the base portion includes silicon.

7. The electronic device according to claim 6, wherein the constituent material of the base portion includes single-crystal silicon,
   the extending direction of the side of the base portion is along a crystal orientation <110> of the single-crystal silicon, and the extending direction of the vibrating arm is along a crystal orientation <100> of the single-crystal silicon.

8. The electronic device according to claim 1, further comprising a terminal portion arranged in parallel with the vibrator element in the plan view.

9. The electronic device according to claim 1, further comprising a lid portion covering the vibrator element and connected to the base portion.

10. An electronic apparatus comprising the electronic device according to claim 1.

11. A moving object comprising the electronic device according to claim 1.

* * * * *